United States Patent
Shapira (10) Patent No.: US 10,890,636 B2
(45) Date of Patent: Jan. 12, 2021

(54) DIAGNOSTIC TOOL FOR EM PERTURBATIONS IN MRI SYSTEMS

(71) Applicant: ASPECT IMAGING LTD., Shoham (IL)

(72) Inventor: Boaz Shapira, Rechovot (IL)

(73) Assignee: ASPECT IMAGING LTD., Shoham (IL)

( * ) Notice: Subject to any disclaimer, the term of this patent is extended or adjusted under 35 U.S.C. 154(b) by 1059 days.

(21) Appl. No.: 14/700,205

(22) Filed: Apr. 30, 2015

(65) Prior Publication Data
US 2015/0338493 A1 Nov. 26, 2015

Related U.S. Application Data

(60) Provisional application No. 62/001,063, filed on May 21, 2014.

(51) Int. Cl.
*G01R 23/00* (2006.01)
*G01R 33/383* (2006.01)
*G01R 33/565* (2006.01)

(52) U.S. Cl.
CPC ......... *G01R 33/383* (2013.01); *G01R 33/565* (2013.01)

(58) Field of Classification Search
CPC .................................................. G01R 33/383
USPC .......................................................... 702/75
See application file for complete search history.

(56) References Cited

U.S. PATENT DOCUMENTS

| 4,694,250 | A | 9/1987 | Iwaoka et al. |
|---|---|---|---|
| 6,011,392 | A | 1/2000 | Zhou et al. |
| 6,781,375 | B2 | 8/2004 | Miyazaki et al. |
| 7,715,899 | B2 | 5/2010 | Harvey et al. |
| 8,593,141 | B1 * | 11/2013 | Radparvar ........... G01R 33/323 324/248 |
| 2002/0149366 | A1 | 10/2002 | Asano et al. |
| 2007/0249929 | A1 | 10/2007 | Jeong et al. |
| 2007/0276221 | A1 | 11/2007 | Warntjes |
| 2013/0178734 | A1 | 7/2013 | Wald et al. |
| 2015/0077102 | A1 * | 3/2015 | Mandal ................ G01N 24/084 324/303 |

(Continued)

OTHER PUBLICATIONS

Norris et al., Online Motion Correction for Diffusion-Weighted Imaging Using Navigator Echoes: Application to RARE Imaging Without Sensitivity Loss, Magnetic Resonance in Medicine, 2001, 45:729-733.

(Continued)

*Primary Examiner* — Hoai V Ho
(74) *Attorney, Agent, or Firm* — Loeb & Loeb LLP (57) ABSTRACT

A method of determining the frequency and amplitude of a perturbing cyclic EM signal in the field of view of an NMR or MRI system during acquisition of a spin-echo spectrum. The frequency ν of the perturbing electromagnetic signal is determined by acquiring a plurality of n 2D NMR spectra with n different values of $T_R$; selecting a peak in each of the n NMR spectra; determining the area of the peak; calculating possible frequencies along the $\Omega_{TR}$ axis; and eliminating results that do not match the position along the $\Omega_\tau$ axis, thereby obtaining ν. The amplitude α of the perturbing electromagnetic signal is determined by calculating the square of the area of the peak.

8 Claims, 9 Drawing Sheets

(56) References Cited

U.S. PATENT DOCUMENTS

2016/0321424 A1* 11/2016 Otvos .................... G06F 19/34

OTHER PUBLICATIONS

Ting et al., Thin-section MR Imaging of rat brain at 4.7T, JMRI 1992; 2:393-399.

* cited by examiner

1. Determine the frequency ν

Acquire $n$ 2D NMR spectra with $n$ different values of $T_R$

↓

Select the peak of interest in each of the $n$ spectra

↓

Determine peak area

↓

For each $n$, calculate possible frequencies along the $\Omega_{TR}$ axis using the relation
$$\nu = n_{TR} SW_{TR_n} - y_n$$

↓

Eliminate results that do not match the position along the $\Omega_\tau$ axis using the relation
$$\Delta\Omega_\tau = \frac{n_\tau \times SW_\tau - \delta y_{TR}}{1 + N_{TR} SW_\tau / SW_{TR}}$$

2. Determine the amplitude α

Calculate the square of the area of the selected peak

↓

Calculate $\phi_{\alpha=1}(t_\tau, t_{TR})$

↓

Calculate the amplitude from the relation
$$\alpha = \sqrt{\frac{2 \times \sum_{\Omega_{TR}, \Omega_\tau} PeakArea(\Omega_\tau, \Omega_{TR})^2 / N}{\sum_{t_{TR}, t_\tau} \phi_{\alpha=1}(t_\tau, t_{TR})^2}}$$

DIAGNOSTIC TOOL FOR EM PERTURBATIONS IN MRI SYSTEMS

FIELD OF THE INVENTION

This invention relates to means and methods for detecting cyclic electromagnetic perturbations that penetrate into the field of view of a magnetic resonance imaging system. In particular, it relates to methods of detecting such perturbations, and determining their amplitudes and frequencies during spin echo measurements.

BACKGROUND OF THE INVENTION

One source of artifacts in MRI measurements is perturbations of the signal by extraneous cyclic electromagnetic (EM) signals that penetrate into the field of view of the instrument. For a perturbation with amplitude α and frequency ν, the ghosting level in a Gradient Recalled Echo (GRE) measurement would be approximately $$\frac{\alpha}{2\nu}.$$

The ghosting in a Spin Echo (SE) measurement would be expected to be larger by a factor of about 2. Thus, a 1% ghost arising from a 50 Hz perturbation would require an amplitude of about 0.23 mGauss in a GRE measurement and about 0.12 mGauss in an SE measurement.

Because NMR is a process with an inherently low signal-to-noise ratio, in order to obtain as much information as possible from the measurement, one must, to the extent possible, eliminate artifacts from the signal. In practice, however, magnetic field inhomogeneity and field drift preclude direct measurement of perturbing cyclic EM signals. Thus, a real-time method of determining the amplitude and frequency of an arbitrary perturbing cyclic EM signal on an NMR or MRI measurement remains a long-felt, yet unmet, need.

SUMMARY OF THE INVENTION

The invention disclosed herein is designed to meet this long-felt need. It is an object of the present invention to disclose a method for determining the frequency of a perturbing cyclic electromagnetic (EM) signal within the field of view of an NMR or MRI instrument during the acquisition of a spin-echo spectrum in said instrument, wherein said method comprises: acquiring a plurality of n 2D NMR spectra, each of said 2D NMR spectra having a $\Omega_{TR}$ axis, a $\Omega_\tau$ axis, and a different value of $T_R$; selecting a peak in each of said n NMR spectra, said peak having a peak value along said $\Omega_\tau$ axis, a peak value along said $\Omega_{TR}$ axis, and an area $A(\Omega_\tau, \Omega_{TR})$; calculating, for each n, possible frequencies of said peak along said $\Omega_{TR}$ axis; and, eliminating results that do not match the peak value of said peak along said $\Omega_\tau$ axis, thereby obtaining ν.

In preferred embodiments of the invention, said step of calculating, for each n, possible frequencies along the $\Omega_{TR}$ axis comprises calculating said possible frequencies by using the relation $\nu = n_{TR} SW_{TR_n} - y_n$.

In preferred embodiments of the invention, said step of eliminating results that do not match the peak value of said peak along said $\Omega_\tau$ axis comprises eliminating results that do not match the peak value of said peak along said $\Omega_\tau$ axis by using $$\Delta\Omega_\tau = \frac{n_\tau \times SW_\tau - \delta y_{TR}}{1 + N_{TR} SW_\tau / SW_{TR}}.$$

In preferred embodiments of the invention, the method comprises a method for determining the frequency and amplitude of a perturbing cyclic EM electromagnetic signal within the field of view of an NMR or MRI instrument during the acquisition of a spin-echo spectrum in said instrument. It is therefore a further object of the present invention to disclose such a method as defined in any of the above, further comprising determining the amplitude α of said perturbing electromagnetic signal, said step of determining the amplitude comprising: calculating $\phi_{\alpha=1}(t_\tau, t_{TR})$; and, determining said amplitude α from $\phi_{\alpha=1}(t_\tau, t_{TR})$.

In preferred embodiments of the invention, said step of calculating $\phi_{\alpha=1}(t_\tau, t_{TR})$ comprises calculating $\phi_{\alpha=1}(t_\tau, t_{TR})$ from $$\phi(t_\tau, t_{TR}) = -\frac{4\pi}{\omega}(\sin(\phi_0 + \omega_x t_\tau + \omega t_{TR})(1 - \cos(\omega t_\tau)),$$

where $\omega_x = \omega(1 + N_{TR} \Delta t_{TR}/\Delta t_\tau)$.

In preferred embodiments of the invention, said step of determining said amplitude determining said amplitude α from $\phi_{\alpha=1}(t_\tau, t_{TR})$ comprises: determining $A(\Omega_\tau, \Omega_{TR})$ of said peak; calculating $A(\Omega_\tau, \Omega_{TR})^2$ of said peak; and, determining said amplitude α from $$\alpha = \sqrt{\frac{2 \times \sum_{\Omega_{TR}, \Omega_\tau} A(\Omega_\tau, \Omega_{TR})^2 / N}{\sum_{t_{TR}, t_\tau} \phi_{\alpha=1}(t_\tau, t_{TR})^2}}.$$

It is a further object of the present invention to disclose such a method as defined in any of the above, wherein n=3.

It is a further object of the present invention to disclose such a method as defined in any of the above, wherein said step of selecting a peak in each of said n NMR spectra comprises manually selecting a peak, and said step of determining $A(\Omega_\tau, \Omega_{TR})$ of said peak comprises (a) manually selecting a region of said spectrum containing said peak, said region having an area A(R); (b) calculating A(R); and (c) setting $A(\Omega_\tau, \Omega_{TR})$ of said peak to be equal to A(R).

It is a further object of this invention to disclose such a method, wherein said NMR or MRI instrument comprises a permanent magnet and a plurality of pole pieces.

BRIEF DESCRIPTION OF THE DRAWINGS

The invention will now be described with reference to the drawings, wherein.

DETAILED DESCRIPTION OF THE PREFERRED EMBODIMENTS

In the following description, various aspects of the invention will be described. For the purposes of explanation, specific details are set forth in order to provide a thorough understanding of the invention. It will be apparent to one skilled in the art that there are other embodiments of the invention that differ in details without affecting the essential nature thereof. Therefore the invention is not limited by that which is illustrated in the figure and described in the specification, but only as indicated in the accompanying claims, with the proper scope determined only by the broadest interpretation of said claims.

Figure 1:
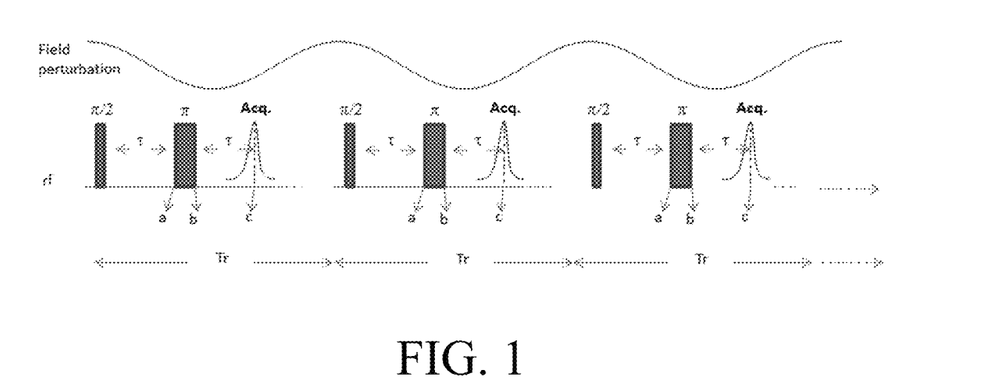
FIG. 1 presents a schematic illustration of a spin-echo sequence of a type known in the art over in the presence of a perturbing cyclic EM signal.

Reference is now made to FIG. 1, which shows a spin-echo (SE) pulse sequence of a type known in the art with an arbitrary cyclic electromagnetic (EM) field perturbation shown; the EM field is shown to illustrate the general principle, and not to indicate any limitations on the frequency or amplitude of the perturbation. The SE sequence comprises a train of 90° pulses each of which is followed a 180° pulse. The time between a particular 90° pulse and the 180° pulse following (which equals the time between the 180° pulse and the consequent echo) is represented by $\tau$, while the time between successive 90° pulses is represented by $T_r$. At the time of the echo (time c in FIG. 1), any phase evolution due to inhomogeneity in the static magnetic field will be canceled, as the echo is the point at which all spins contribute constructively to the received signal.

The evolution of the magnetization in the transverse plane will have the form given by eq 1:

$$S(t) = \exp\left[i\alpha 2\pi \int_t \cos(\phi_0 + \omega t')dt'\right] \quad (1)$$

where $\phi_0$ is the phase of the perturbation at the beginning of the experiment, and $\alpha$ is the amplitude of the perturbation.

It is within the scope of the invention to obtain the desired information regarding the perturbation from the phase of the signal. At times a, b, and c, the phase due to the perturbing EM field is given by eqs 2:

$$\phi_a = \alpha 2\pi \int_0^\tau \cos(\phi_0 + \omega t')dt' = \frac{\alpha 2\pi}{\omega}(\sin(\phi_0 + \omega\tau) - \sin(\phi_0)) \quad (2)$$

$$\phi_b = \phi_a$$

$$\phi_c = \alpha 2\pi \int_\tau^{2\tau} \cos(\phi_0 + \omega t')dt' + \phi_b =$$

$$\frac{\alpha 2\pi}{\omega}(\sin(\phi_0 + 2\omega\tau) - 2\sin(\phi_0 + \omega\tau) + \sin(\phi_0))$$

As shown in FIG. 1, the SE experiment is repeated N times (N≥1) with time $T_r$ between each excitation ($T_r \gg T_2$). The phase detected at each time point c (i.e. at the echo) will have the form given by eq 3:

$$\phi_{ci} = \frac{\alpha 2\pi}{\omega}(\sin(\phi_i + 2\omega\tau) - 2\sin(\phi_i + \omega\tau) + \sin(\phi_i)) \quad (3)$$

The phase $\phi_i$ depends on the index i of the pulses in the echo train according to eq 4:

$$\phi_i = \phi_0 + \omega(i-1)T_r \quad (4)$$

Substitution of the expression for $\phi_i$ into eq 3 yields, after use of some trigonometric identities, eq 5:

$$\phi_{ci} = -4\frac{\alpha 2\pi}{\omega}(\sin(\phi_0 + \omega(i-1)T_r + \omega\tau) + \sin^2(\omega\tau/2)) \quad (5)$$

The condition given by eq 6 should be met in order to achieve the maximum sensitivity to the perturbation:

$$\frac{\tau\omega}{2} = \frac{\pi}{2} + n\pi \quad (6)$$

where n is a nonnegative integer. Inserting eq 6 into eq 3 yields eq 7:

$$\phi_{ci}^{max} = 4\frac{\alpha 2\pi}{\omega}(-1)^{2n}\sin(\phi_i) \quad (7)$$

If the frequency of the perturbation is known or can be predicted a priori, the 1-D analysis given above, in which all measurements are made with a single fixed value of $\tau$ should be sufficient to find the amplitude of the perturbing signal. In general, however, this is not the case, so in order to find the value of the frequency of the perturbing signal (or the values of the frequencies in cases in which there is more than one perturbing signal), the measurement should be made over a range of values of $\tau$. In the 2-D version of the experiment, the phase is given by eq 8:

$$\phi(t_\tau, t_{TR}) = -4\frac{\alpha 2\pi}{\omega} \quad (8)$$

$$(\sin(\phi_0 + \omega(n\Delta t_\tau + nN_{TR}\Delta t_{TR} + m\Delta t_{TR}))\sin^2(\omega\Delta t_\tau/2))$$

with $t_r$ and $t_{TR}$ as defined in eqs 9:

$$t_\tau = \tau + n\Delta t_\tau, n = 1, 2 \ldots N_\tau$$

$$t_{TR} = m\Delta t_{TR}, m = 1, 2 \ldots N_{TR} \quad (9)$$

where $\Delta t_{TR} = T_r$.

Figure 2:
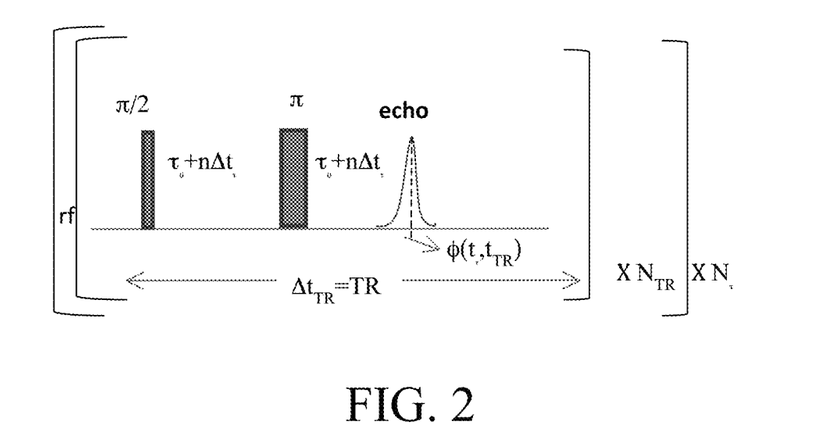
FIG. 2 presents a schematic illustration of the 2-D cyclic EM perturbation measurement in one embodiment of the invention herein disclosed.

Reference is now made to FIG. 2, which illustrates the 2-D experiment. For each value of $t_\tau$, the scan comprises $N_{TR}$ measurements repeated $N_\tau$ times.

Figure 3:
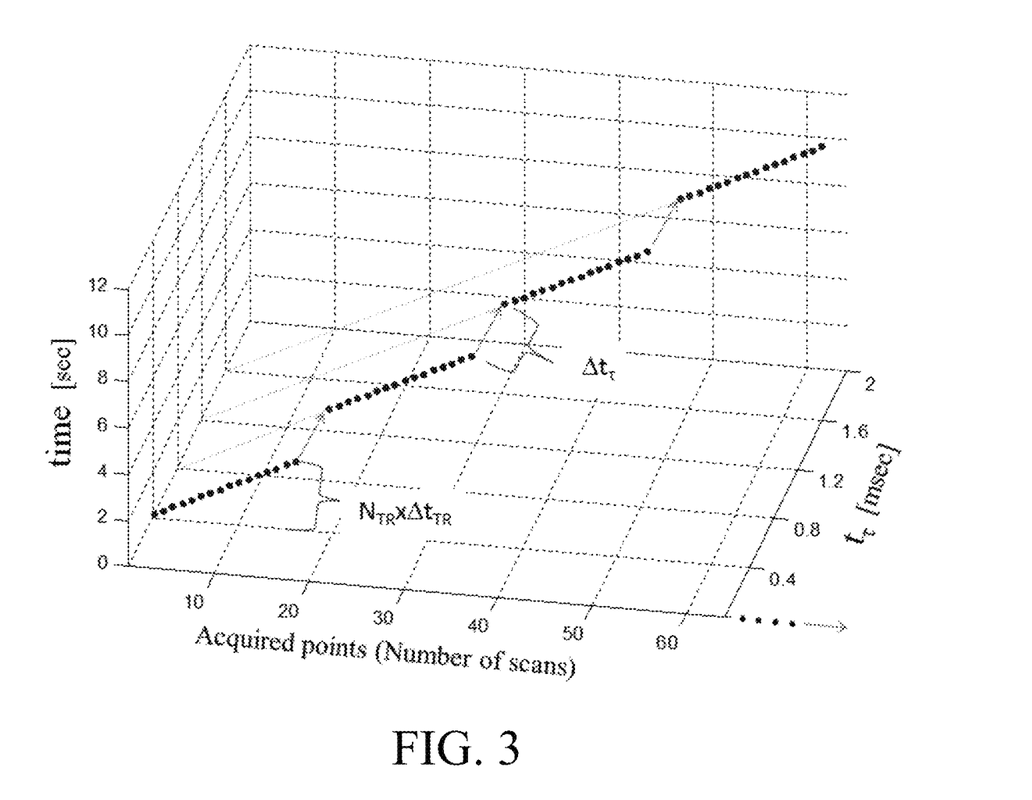
FIG. 3 illustrates graphically the acquired data points as a function of time and of $t_\tau$ for a 2-D cyclic EM perturbation measurement in one embodiment of the invention herein disclosed.

In this measurement, the time axes are not the conventional 2 independent time axes. Rather, for each $t_{TR}$ row, $t_\tau$ jumps with a gap equal to $N_{TR} \times T_r$. Reference is now made to FIG. 3, which illustrates graphically the acquired data points as a function of time and of $t_\tau$.

The analysis of the phase is more conveniently performed in the frequency domain. Eq 8 can be rearranged to provide eq 10a:

$$\phi(t_\tau, t_{TR}) = -\frac{\alpha 4\pi}{\omega}(\sin(\phi_0 + \omega_x t_\tau + \omega t_{TR})(1 - \cos(\omega t_\tau))) \quad (10a)$$

where $\omega_x$ is given by eq 10b:

$$\omega_x = \omega(1 + N_{TR}\Delta t_{TR}/\Delta t_\tau) \quad (10b)$$

The amplitude of the perturbing signal can be obtained from the signal in the time domain. Ideally, it can be extracted from the expression given in eq 7 under the conditions given in eq 6.

Under the assumption that the Nyquist criterion is met, the peak positions obtained after Fourier transformation are given by eq 11:

$$\Phi(\Omega_{TR}, \Omega_\tau) = \delta(\Omega_{TR} \pm \omega)\delta(\Omega_\tau \pm [\omega_x \pm \omega]) \quad (11)$$

In the presence of a perturbing cyclic EM signal, each peak in the spectrum will have satellite peaks along the $\Omega_\tau$ axis, the difference between the actual peak in the spectrum and the satellite peak being equal to the perturbation frequency. The three peaks (spectral peak and two satellites) correspond to the $1-\cos(\omega t_\tau)$ term in eq 10a. Because the signal is spread over several peaks, the amplitude of the peaks in the frequency domain is approximately one fourth of the amplitude in the time domain.

In practice, the frequencies along the $\Omega_{TR}$ and $\Omega_\tau$ axes are in fact folds of $\omega$ and $\omega_x$. Since TR is typically >100 ms, the spectral width (SW) $SW_{TR}$ will typically be less than 10 Hz. Regarding $\omega_x$, along the $\Omega_\tau$ axis, $$\frac{N_{TR}\Delta t_{TR}}{\Delta t_\tau} \gg 1,$$

and from the above expression for $\omega_x$, it is clear that $\omega_x \gg SW_\tau$. The general expression for folding along the $\Omega_{TR}$ and $\Omega_\tau$ axes is given by eqs 12:

$$\omega_{TR}^{fold} = \pm[\text{round}(\omega \times TR)/TR - \omega]$$

$$\omega_x^{fold} = \pm[\text{round}(\omega_x \times \Delta t_\tau)/\Delta t_\tau - \omega_x] \quad (12)$$

The following algorithm for determining the frequency and amplitude of a perturbing cyclic EM electromagnetic field entering the FOV of an NMR or MRI measurement, derived from the above analysis, represents a preferred embodiment of the invention disclosed herein.

The first step of the algorithm is to determine the perturbation frequency. For a given peak point $(x_n, y_n)$, the frequency will be given by eqs 13:

$$v = \frac{n_\tau \times SW_\tau + x_n}{1 + N_{TR}SW_\tau/SW_{TR}} \quad (13)$$

$$v = n_{TR} \times SW_{TR} - y_n$$

where $$n_\tau = \text{round}\left[\frac{v\left(\frac{1 + N_{TR}SW_\tau}{SW_{TR}}\right)}{SW_\tau}\right] \text{ and } n_{TR} = \text{round}\left[\frac{v}{SW_{TR}}\right].$$

There are a number of possible sources of error in the determination of the perturbation frequency. Among these are the resolution of the measurement, $\delta x_\tau$ and $\delta y_{TR}$, which are given by $$\delta x_\tau = \frac{SW_\tau}{N_\tau} \text{ and } \delta y_{TR} = \frac{SW_{TR}}{N_{TR}},$$

respectively, and the instability of the frequency during detection of the signal. The possible error due to the limited resolution of the measurement propagates toward the calculation of $v$ along the $\Omega_\tau$ axis as $$\delta v_\tau = \frac{n_\tau SW_\tau - \delta x_\tau}{1 + \frac{N_{TR}SW_\tau}{SW_{TR}}},$$

while the possible error due to frequency instability leads to line broadening as well as a shift in the position of the frequency, which can be significant when spectra with different SWs are compared. These errors can lead to erroneous results, particularly along the $\Omega_\tau$ axis. Hence, for the determination of the frequency of the perturbing signal, the information is first obtained along the $\Omega_{TR}$ axis, with the $\Omega_\tau$ axis used as a constraint for refining the value initially obtained.

The algorithm for determining the frequency of the perturbing signal begins by making a plurality of measurements with different $SW_{TR}$s ($SW_{TR1}$, $SW_{TR2}$, ...). For each peak $y_n$ in the spectrum measured along the $\Omega_{TR}$ axis, the frequency of the perturbing signal will be given by eq 14:

$$v = n_{TR}SW_{TR_n} - y_n \quad (14)$$

For each spectrum n, the SW can be set from the approximate relation given as eq 15:

$$SW_{TR_n} \approx \frac{\delta v_{TR_{n-1}}}{4} + SW_{TR_{n-1}} \quad (15)$$

As long as y does not fall near the edge of SW/2, using the SW given in eq 15 will ensure that $n_{TR_n}$ is equal for every $TR_n$. In principle, there are only two variables, n and v, so two runs are all that is required to determine v. Due to ambiguities in the measurements, however, in preferred embodiments of the invention, at least three measurements are made.

Additional constraints on the value of the frequency determined by the algorithm come from "low resolution" results along the $\Omega_\tau$ axis. The results should fold along the $\Omega_\tau$ axis within the boundaries $\Delta\Omega_\tau$ according to eq 16:

$$\Delta\Omega_\tau = \frac{n_\tau \times SW_\tau - \delta y_{TR}}{1 + N_{TR}SW_\tau/SW_{TR}} \quad (16)$$

where $\delta y_{TR}$ is the error along the $\Omega_{TR}$ axis.

After the perturbation frequency has been determined, the algorithm continues with determination of the perturbation amplitude. Given the frequency determined as described above, one could in principle determine the amplitude from fitting the time-domain data to eq 10a. This is a straightforward process only in the case where there is a single coherent perturbing frequency. In practice, this simple case rarely occurs, as the perturbation is frequently unstable or there is more than one perturbing frequency. In preferred embodiments of the invention, the determination of the amplitude of the perturbation(s) is performed in the frequency domain, where different perturbing frequencies are separable.

According to the Plancherel Theorem, the integral of the square of a function is equal to the integral of the square of its Fourier Transform. This result leads immediately to eq 17:

$$\frac{2\sum_{\Omega_\tau,\Omega_{TR}} [A(\Omega_\tau,\Omega_{TR})]^2}{N} \approx \sum_{t_{TR},t_\tau} \phi(t_\tau, t_{TR})^2 \quad (17)$$

In eq 17, $A(\Omega_\tau, \Omega_{TR})$ is the area of the selected peak, and N is the normalization constant between the Fourier Transform and the Inverse Fourier Transform. The factor of 2 is due to the symmetry of the spectrum. The phase $\phi(t_\tau, t_{TR})$ is given by eq 10a above. Because the peak area can lose as much as 10% of the perturbation intensity as it is smeared along the axes, the error in the estimated amplitude may be as much as ±10%.

Thus, in preferred embodiments of the invention, following the calculation of the frequency of the perturbation, the amplitude is then determined by measuring the peak area of a spectral peak in the frequency domain and squaring the area. For a given $\nu$, $\phi_{\alpha=1}(t_\tau, t_{TR})$ is calculated according to eq 10a with $\alpha$ set to 1 Hz. The amplitude of the perturbing signal $\alpha_{exp}$ is then determined from eq 18:

$$\alpha_{exp} = \sqrt{\frac{2 \times \sum_{\Omega_{TR},\Omega_\tau} A(\Omega_\tau,\Omega_{TR})^2/N}{\sum_{t_{TR},t_\tau} \phi_{\alpha=1}(t_\tau, t_{TR})^2}} \quad (18)$$

Figure 4:
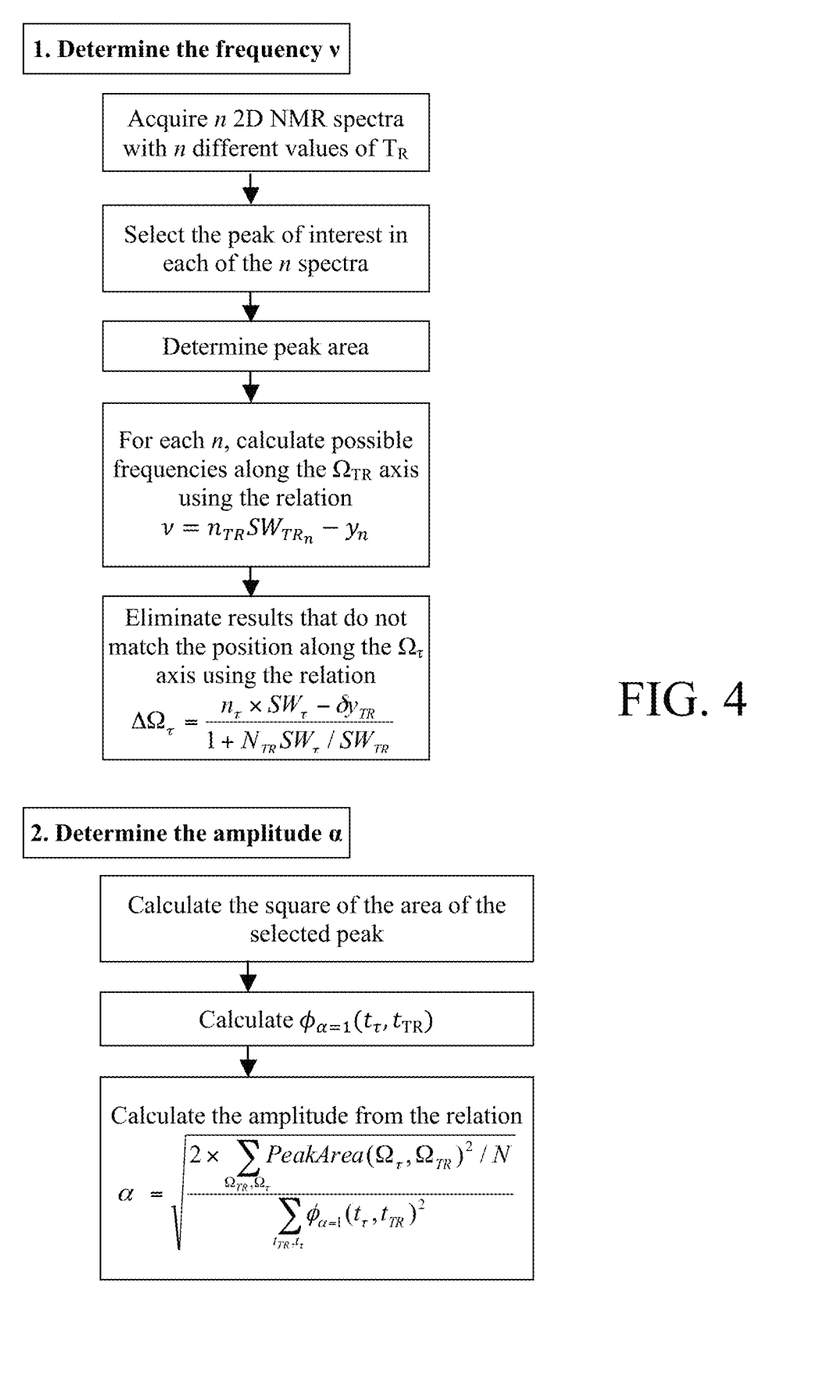
FIG. 4 provides a flowchart of the steps of one non-limiting embodiment of the method herein disclosed.

Reference is now made to FIG. 4, which summarizes the steps of a preferred embodiment of the algorithm herein disclosed for determining the frequency and amplitude of an cyclic EM perturbation in the FOV of an NMR or MRI apparatus. In some embodiments of the invention, the step of picking the peak is an interactive one in which the operator chooses the peak manually using the GUI of the operating system of the NMR instrument. In some embodiments of the invention, the operator selects a region of the spectrum that includes the selected peak, determines the area A(R) of the selected region, and sets $A(\Omega_\tau, \Omega_{TR})=A(R)$. The peak picking step is illustrated in the figures accompanying the Examples below.

EXAMPLES

The following non-limiting examples are provided to help enable a person having ordinary skill in the art make and use the invention herein disclosed.

Example 1

Figure 5A:
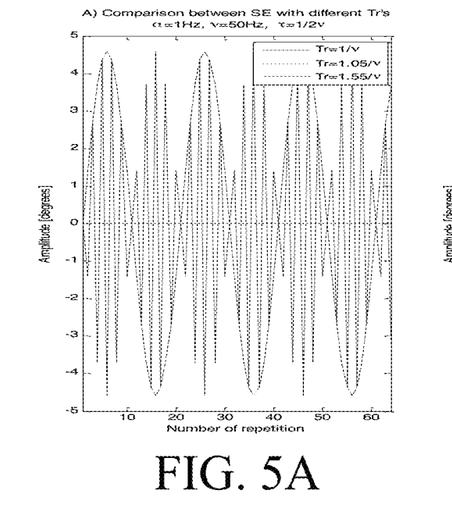
FIGS. 5A and 5B present graphically the results of several 1-D simulations illustrating the conditions under which maximum sensitivity will be achieved.
Figure 5B:
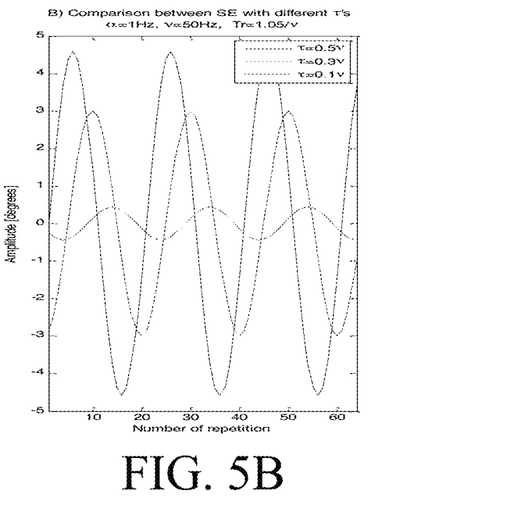

Reference is now made to FIGS. 5A and 5B, which illustrate graphically simulations of the signal at the peak of the echo (time point c in FIG. 1) for a signal with a perturbation of frequency $\nu$=50 Hz, $\alpha$=1 Hz. FIG. 5A shows a graph of the signal amplitude as a function of the number of repetitions of the measurement for simulations in which $\tau$ is fixed to have a value of half a cycle, but with different values of $T_R$ (1/$\nu$, 1.05/$\nu$, and 1.55/$\nu$). The figure clearly shows that when $T_R$ is one cycle of the perturbing signal, the perturbation is zero. FIG. 5B shows a graph of the same signal and perturbation, but in this case, $T_R$ was fixed to 1.05/$\nu$ and the signal is plotted for three different values of $\tau$ (0.1$\nu$, 0.3$\nu$, and 0.5$\nu$). FIG. 5B shows that, as predicted by eqs 6 and 7, the maximum sensitivity is achieved when $\tau$=0.5$\nu$.

Example 2

Figure 6A:
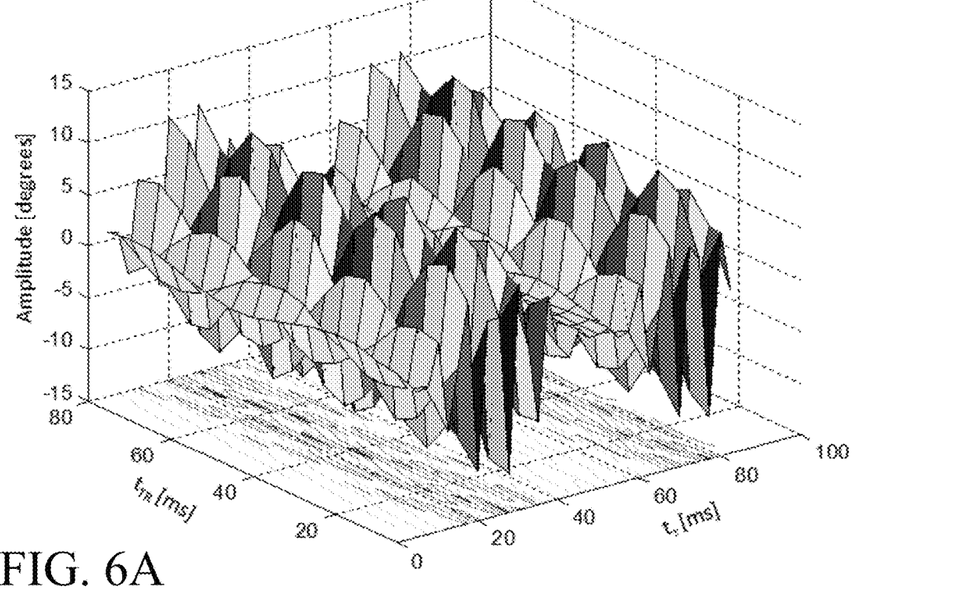
FIGS. 6A and 6B present time and frequency domain signals for a simulated 20 Hz perturbation.
Figure 6B:
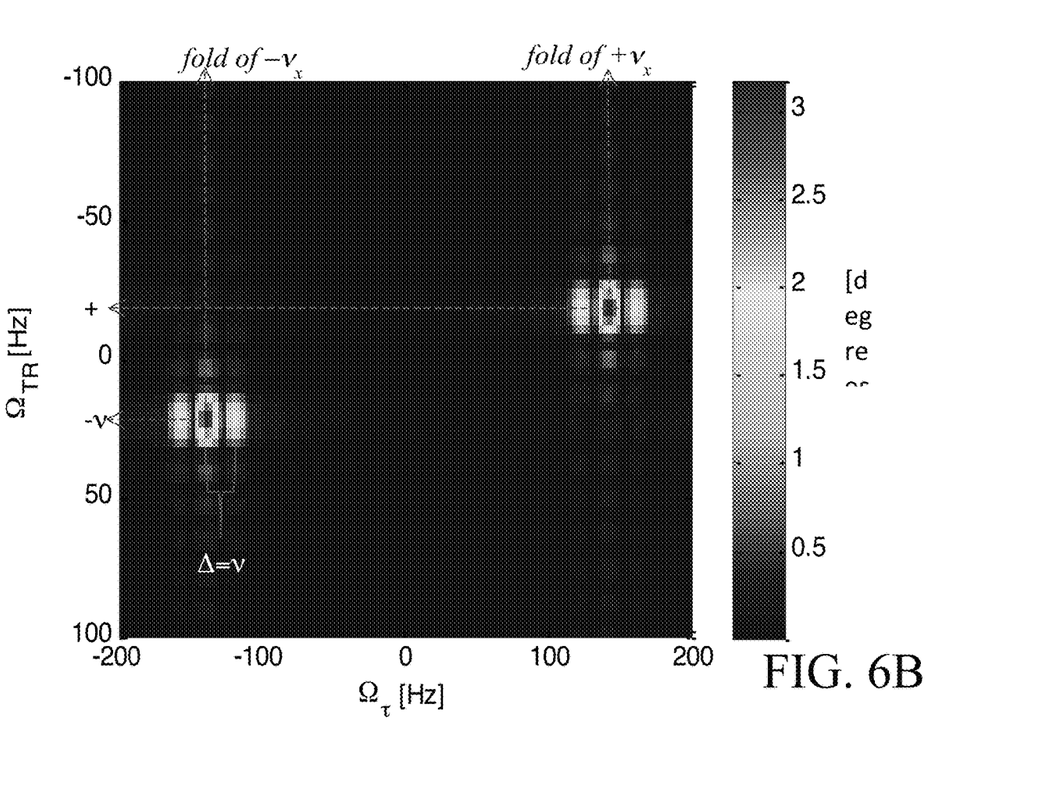

Reference is now made to FIGS. 6A and 6B, which illustrate a simulation of the time domain signal for a case in which there is a perturbing signal having a frequency $\nu$=20 Hz. FIG. 6A shows the time-domain signal for a measurement in which $\Delta t_{TR}$=5 ms, $N_{TR}$=16, $\Delta t_\tau$=2.5 ms, and $N_\tau$=16. The frequency domain signal (i.e. the FT of the signal shown in FIG. 6A) is shown in FIG. 6B; in this case, $N_\tau$=32, and $\nu_x$, which is folded along the $\Omega_\tau$ axis, is 1300 Hz. FIG. 6B shows that the frequency difference along the $\Omega_\tau$ axis between the main peak and one of its satellites is the perturbation frequency $\nu$. The three peaks correspond to the expression 1−cos($\omega t_\tau$) in eq 10. As explained above, the position of the central peaks is, however, a fold of $\omega_x$ ($\nu_x$).

Example 3

Figure 7:
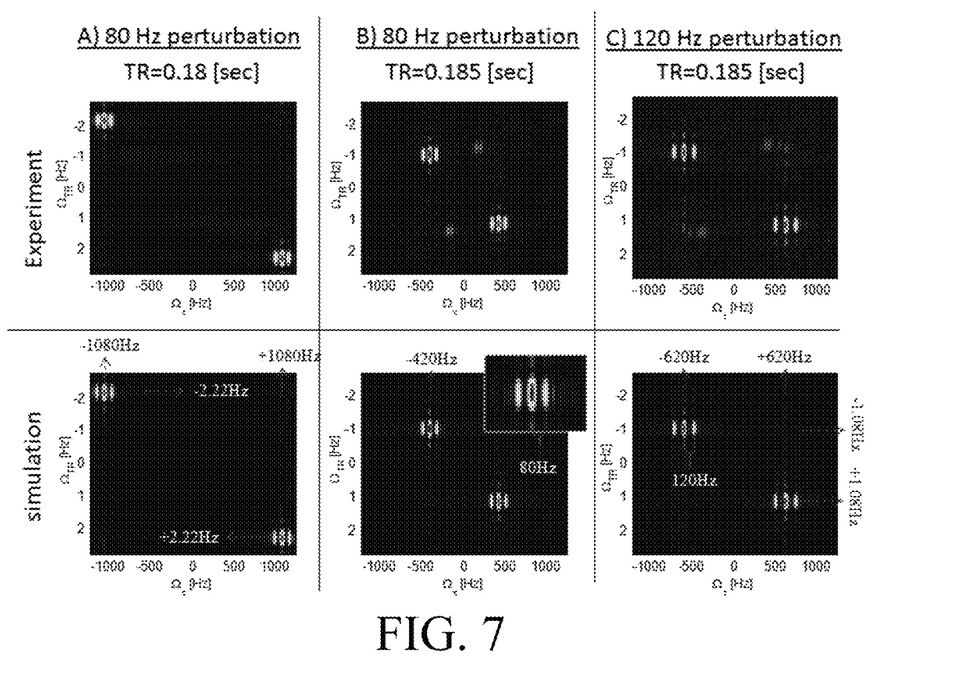
FIG. 7 compares experimental and simulated spectra for perturbations of known frequency and amplitude.

In order to validate the method herein disclosed (eq 10), a known cyclic EM perturbation was introduced into the FOV of an MRI instrument while running the pulse sequence disclosed herein. A signal generator was connected into the Y gradient power supply of a commercially available MRI instrument ("Wrist" system, Aspect Imaging, Toronto, Canada). Reference is now made to FIG. 7, which shows the experimental and simulated spectra. In the spectra shown in FIGS. 7A and 7B, the perturbation frequency was 80 Hz and the perturbation amplitude 4 mA at the input. The TRs are 180 ms and 185 ms, respectively, with $N_{TR}$=16 in both cases; at $\Delta t_\tau$=0.4 ms, $N_\tau$=64. In the spectrum shown in FIG. 7C, the perturbation frequency was 120 Hz and the perturbation amplitude was 6 mA at the input.

Before the phase maps were set in a 2D form, the DC and linear orders were determined from the 1D signal of the phase, $\phi(k_{TR})$, where $k_{TR}$=1 ... ($N_{TR} \times N_\tau$).

As can be seen from the figures, there is good agreement between the experimental (top row) and simulated (bottom row) spectra. The peaks of the spectrum are folded on both axes, and follow the aliasing rules given in eq 12. The peak-to-peak amplitude determined by the method herein disclosed for the experimental spectra (not shown in FIG. 7) was 10° for the 80 Hz perturbation and 12° for the 120 Hz perturbation.

Example 4

Figure 8:
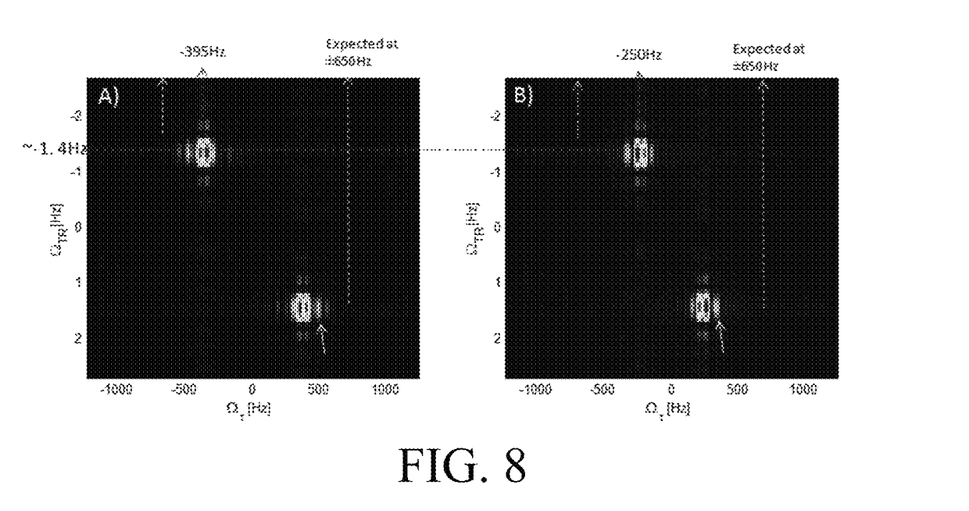
FIG. 8 presents spectra that show effects of a 50 Hz perturbation arising from line cyclic EM electricity.

A measurement was made of 50 Hz perturbation arising from line cyclic EM electricity. Reference is now made to FIG. 8, which shows two runs made on a commercially available MRI instrument ("Wrist" system, Aspect Imaging, Toronto, Canada) taken under identical conditions ($\Delta t_{TR}$=185.3 ms, $N_{TR}$=16, $\Delta t_\tau$=0.4 ms, and $N_\tau$=64), but 40 minutes apart. The gradient amplifier was turned off for this experiment. As expected, the 50 Hz perturbation folded along the $\Omega_{TR}$ axis (horizontal dotted line). Along the $\Omega_\tau$ axis, however, the folding pattern is different than the one expect in three different ways. First, the peaks do not sit on the expected $v_x$ fold (±650 Hz, indicated by a vertical dotted line). Second, the peak position shifted between the two runs along the $\Omega_\tau$ axis. Finally, the peak pattern does not match the theoretical prediction. In the time domain, the perturbation amplitude is about 1°.

The shift in the position along the $\Omega_\tau$ axis indicates that the perturbation frequency changed between the two runs; the resolution along the $\Omega_{TR}$ axis is too small for any shift to be noticed in the graphs shown in FIG. 8. By using eqs 12 and 10a, it is possible to extract the perturbing frequency. This analysis yields a perturbation frequency of 49.966 Hz for the spectrum shown in FIG. 8A and 49.945 Hz for the spectrum shown in FIG. 8B.

The foregoing analysis indicates that the perturbing frequency is in fact shifting between several values around its nominal value of 50 Hz. Mathematically, the perturbation can be expressed by eq 19:

$$\omega(t)=\omega+\beta \sin(\varepsilon t) \quad (19)$$

A second weak satellite peak is observed in the spectrum (indicated by the arrow in FIG. 8). This weak peak presumably originates from a second 50 Hz source. In the presence of a second perturbing signal, the expression given in eq 1 above is modified to yield eq 20:

$$S(t) = \exp\left[i2\pi \int_t \{\alpha_1\cos(\phi_0 + \omega_1(t')t') + \alpha_2\cos(\phi_0 + \omega_2(t')t')\}dt'\right] \quad (20)$$

where $\omega_1(t)=\omega_1+\beta_1 \sin(\varepsilon_1 t)$ and $\omega_2(t)=\omega_2+\beta_2 \sin(\varepsilon_2 t)$.

Figure 9:
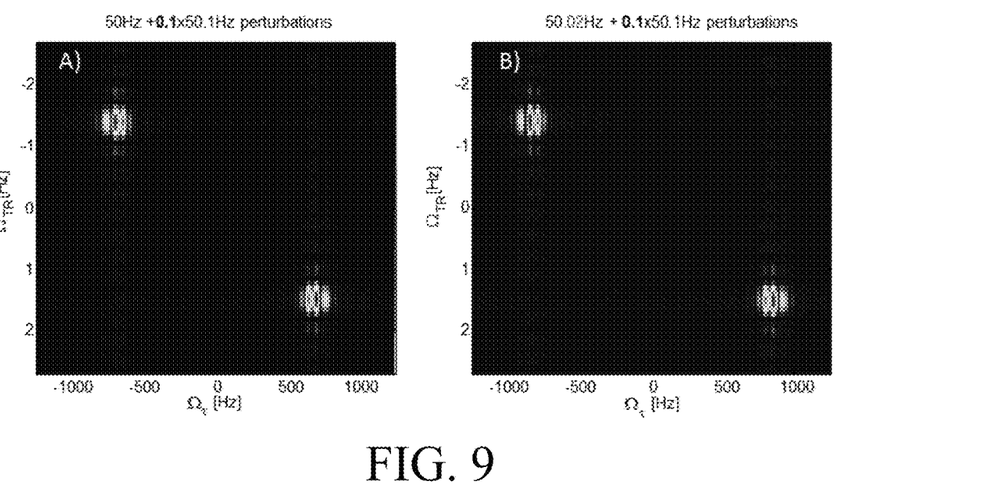
FIG. 9 presents simulated spectra that show effects of two separate perturbations of approximately 50 Hz frequency.

The expression given in eq 20 cannot be solved analytically. Reference is now made to FIG. 9, which presents numerical simulations of the experimental spectrum using eq 20. FIG. 9A presents a simulation in which $\omega_1=2\pi\times50$ Hz, $\alpha_1=1$, $\beta_1=4\times10^{-2}$, $\varepsilon_1=2\pi\times10^{-3}$ Hz, $\omega_2=2\pi\Delta50.1$ Hz, $\alpha_2=0.1$, $\beta_1=4\times10^{-2}$, and $\varepsilon_1=2\pi\times10^{-3}$ Hz. FIG. 9B presents a simulation in which $\omega_1=2\pi\times50.02$ Hz and the remaining parameters were the same as in the simulation shown in FIG. 9A. In both cases, the parameters $\Delta t_{TR}$, $N_{TR}$, $\Delta t_\tau$, and $N_\tau$ were set to be equal to those used in the actual experiment.

As can be seen in the figure, the experimental results can be accurately reproduced by using the model disclosed herein even in the case in which there are two perturbing signals of similar frequencies.

Example 5

Figure 10:
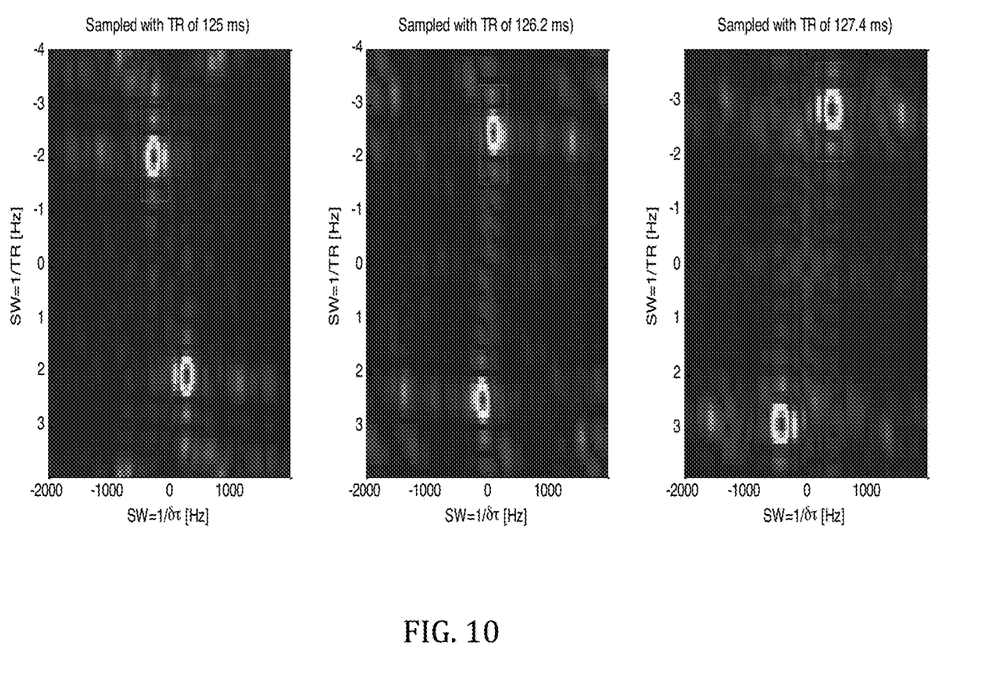
FIG. 10 presents spectra obtained during a second set of measurements of 50 Hz perturbation.

As a second example of the use of the method to identify a 50 Hz perturbation in the FOV of an NMR instrument, an MRI instrument of the same type as those used in the previous examples was placed in a hall of a research facility (i.e. an area with no magnetic shielding). The gradient amplifier was turned off for the duration of the run. Reference is now made to FIG. 10, which shows spectra taken with a pulse width of 280 µs, $N_{TR}$=16, and $N_\tau$=32. The total time of the experiment was 3.2 min. The peak used for the analysis of the perturbation's amplitude (eq 18) was chosen manually by the operator using the instrument's GUI; the areas picked are indicated by rectangles on the spectra. The results were analyzed by using the algorithm disclosed herein, and the perturbation was found to have a frequency of 50 Hz and an amplitude of (0.16±0.016) mGauss.

Example 6

Figure 11:
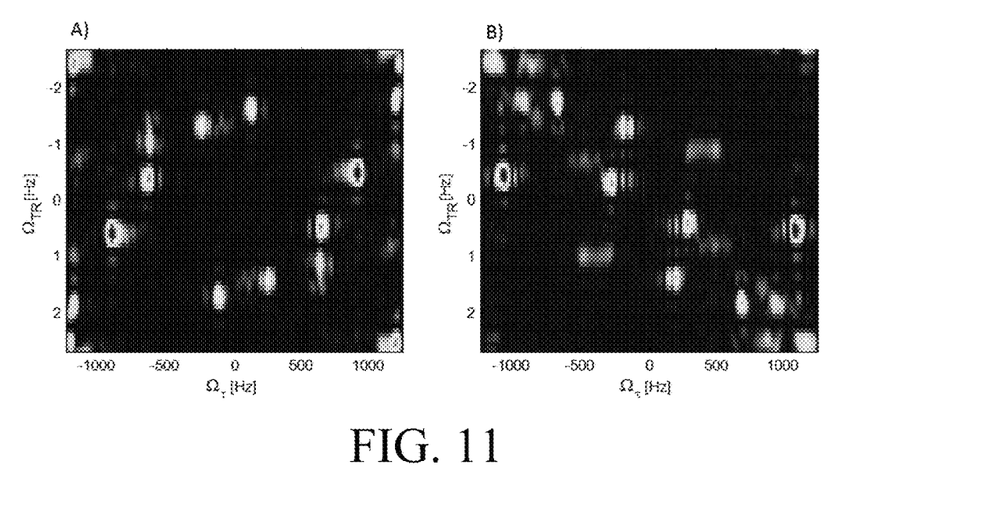
FIG. 11 presents spectra that show effects of perturbations due to fans attached to the MRI instrument's magnet.

The algorithm disclosed herein was used to measure the perturbation arising from the fans located on top of the magnet, a source of perturbation that is known to interfere with MRI spectra. The measurement was run in under the following conditions: $\Delta t_{TR}$=185.3 ms, $N_{TR}$=16, $\Delta t_\tau$=0.4 ms, and $N_\tau$=64. Reference is now made to FIG. 11, which shows two spectra, measured 15 minutes apart, that show artifacts due to perturbations from the fans mounted on the instrument. The multiple pairs of peaks in the spectra indicate that there is more than one perturbing frequency, and the shifts in the peak positions from run to run indicate that, as in Example 4 above, the perturbing frequency is not constant over time. The largest amplitude that was measured in the time domain was 5°.

Example 7

A measurement was made of perturbing signals from fans attached to the magnet in an MRI instrument of the same type as those used in the previous examples. The instrument was placed in a room with magnetic shielding, and showed relatively little perturbation at 50 Hz. In order to detect the perturbations introduced by the operation of the fans more easily, TR was set to ~140 ms instead of 125 ms, which produced clearer images. The scans were performed with a pulse width of 280 µs, $N_{TR}$=16, and $N_\tau$=64. The total time for the measurement was 7.2 min.

Figure 12:
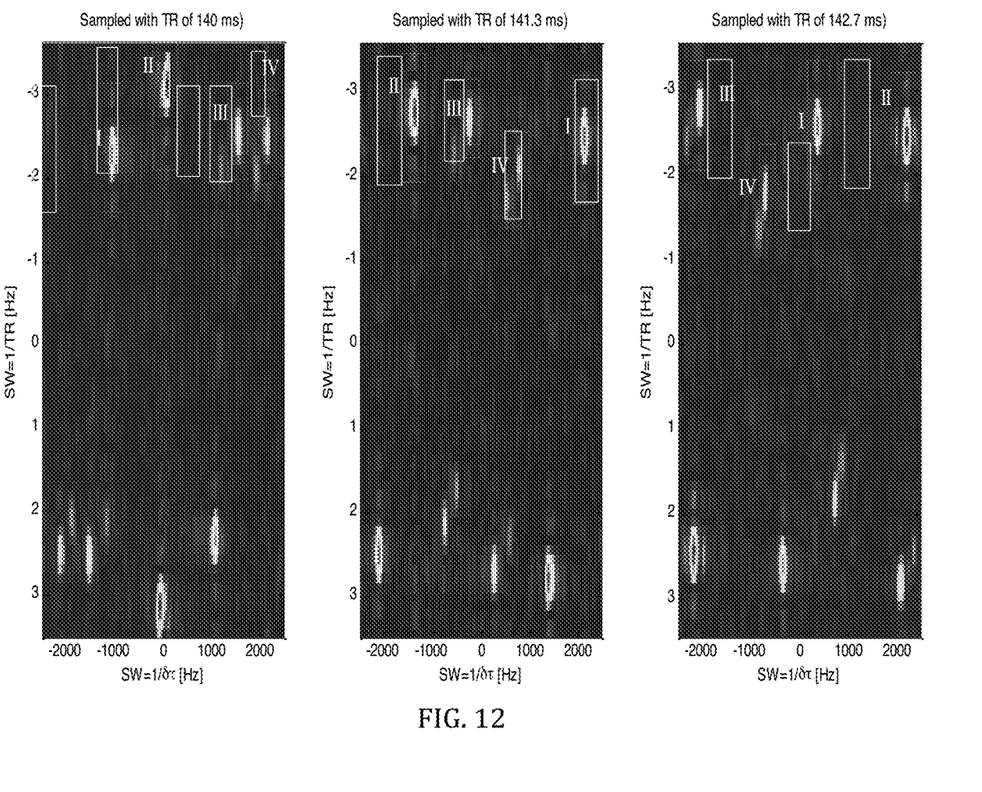
FIG. 12 presents spectra that show effects of perturbations due to fans attached to the MRI instrument's magnet in a second set of experimental runs; and, FIG. 13 presents spectra that show effects of perturbations due to the gradient amplifier.

Reference is now made to FIG. 12, which presents spectra showing artifacts due to perturbations from fans operating at low speed. The four peaks chosen for analysis are indicated by the rectangles. When the peaks were analyzed by using the algorithm herein disclosed, four perturbations were found: (I) $v$=16.5 Hz, $\alpha$=0.06 mGauss; (II) $v$=32.5 Hz, $\alpha$=0.07 mGauss; (III) $v$=16.75 Hz, $\alpha$=0.04 mGauss; and (IV) $v$=33.25 Hz, $\alpha$=0.03 mGauss. The amplitudes of these perturbations were all much smaller than those arising from the 50 Hz noise shown in Examples 4 and 5 above.

Example 8

Figure 13:
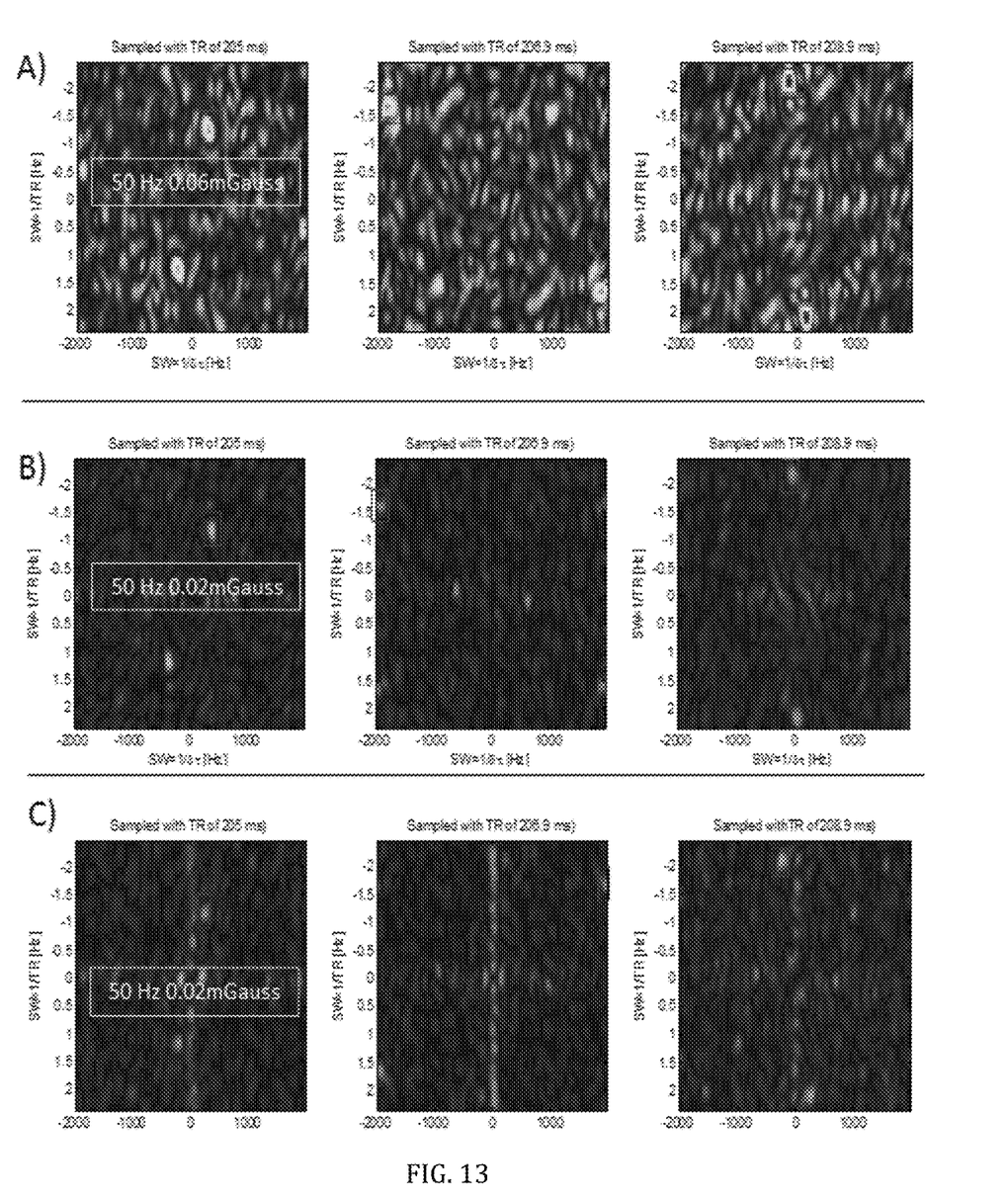

Is some attenuating field penetrates into the magnet through the gradient wires, it will have a greater effect in positions that are off center than in the center of the FOV because the current lines are linear in strength across the gradient axis. In order to test this effect, a spatial phantom of ~4 mm thickness was set ~50 mm off center from the Y gradient (the detected gradient in this case). Reference is now made to FIG. 13, which presents results from three determinations of the effect of perturbations from the gradient amplifier on the spectrum. FIG. 13A shows a spectrum with the slice off center and the gradient demand along the detected gradient was on (gradient DAC=0). FIG. 13B shows a spectrum taken under the same conditions, but with the gradient demand off. FIG. 13C shows a spectrum taken under the same conditions as the spectrum shown in FIG. 13A but with the slice moved to the center of the gradient.

Each of FIGS. 13A, 13B, and 13C presents three spectra, taken with $T_R$=205 ms, 206.9 ms, and 208.9 ms, respectively; the longer $T_R$ in the third spectrum of each group was used in order to obtain a higher signal-to-noise ratio, the volume of the phantom beings smaller. The selected peaks are indicated in the spectra by rectangles.

When the spectra are analyzed using the method disclosed herein, a 50 Hz perturbation is detected. In the spectra shown in FIG. 13A, the amplitude of the perturbation is 0.06 mGauss, while for the spectra shown in FIGS. 13B and 13C, the amplitude is 0.02 mGauss. The spectra taken with the gradient demand off disclose the presence of a small 50 Hz perturbation from an external source.

What is claimed is:

1. A method for a magnetic resonance device to remove a perturbing cyclic electromagnetic signal included within a spin-echo spectrum measurement taken by the magnetic resonance device, the method comprising:
   acquiring, by the magnetic resonance device, a plurality of n 2D NMR spectra, each of said 2D NMR spectra having a $\Omega_{TR}$ axis, a $\Omega_\tau$ axis, and a different value of $T_R$;
   selecting, by the magnetic resonance device, a peak in each of said n NMR spectra, said peak having a peak value along said $\Omega_\tau$ axis, a peak value along said $\Omega_{TR}$ axis, and an area $A(\Omega_\tau, \Omega_{TR})$;
   calculating, by the magnetic resonance device, for each n, possible frequencies of said peak along said $\Omega_{TR}$ axis;
   eliminating, by the magnetic resonance device, results that do not match the peak value of said peak along said $\Omega_\tau$ axis, thereby obtaining ν;
   determining the amplitude α of said perturbing electromagnetic signal, comprising:
   calculating $\phi_{\alpha=1}(t_\tau, t_{TR})$ from $$\phi(t_\tau, t_{TR}) = -\frac{4\pi}{\omega}(\sin(\phi_0 + \omega_x t_\tau + \omega t_{TR})(1 - \cos(\omega t_\tau)),$$

where $\omega_x = \omega(1 + N_{TR}\Delta t_{TR}/\Delta t_\tau)$;
   determining said amplitude α from $\phi_{\alpha=1}(t_\tau, t_{TR})$;
   removing, by the magnetic resonance device, said perturbing electromagnetic signal from the spin-echo measurement to obtain a spin-echo signal without the unwanted electromagnetic signal; and
   producing, by the magnetic resonance device, at least one magnetic resonance image based on the obtained spin-echo signal.

2. The method according to claim 1, wherein said step of calculating, for each n, possible frequencies along the $\Omega_{TR}$ axis comprises calculating said possible frequencies by using the relation $v = n_{TR} SW_{TR_n} - y_n$.

3. The method according to claim 1, wherein said step of eliminating results that do not match the peak value of said peak along said $\Omega_\tau$ axis comprises eliminating results that do not match the peak value of said peak along said $\Omega_\tau$ axis by using $$\Delta\Omega_\tau = \frac{n_\tau \times SW_\tau - \delta y_{TR}}{1 + N_{TR}SW_\tau/SW_{TR}}.$$

4. A method for a magnetic resonance device to remove a perturbing cyclic electromagnetic signal included within a spin-echo spectrum measurement taken by the magnetic resonance device, the method comprising:
   acquiring, by the magnetic resonance device, a plurality of n 2D NMR spectra, each of said 2D NMR spectra having a $\Omega_{TR}$ axis, a $\Omega_\tau$ axis, and a different value of $T_R$;
   selecting, by the magnetic resonance device, a peak in each of said n NMR spectra, said peak having a peak value along said $\Omega_\tau$ axis, a peak value along said $\Omega_{TR}$ axis, and an area $A(\Omega_\tau, \Omega_{TR})$;
   calculating, by the magnetic resonance device, for each n, possible frequencies of said peak along said $\Omega_{TR}$ axis;
   eliminating, by the magnetic resonance device, results that do not match the peak value of said peak along said $\Omega_\tau$ axis, thereby obtaining ν;
   determining, by the magnetic resonance device, said amplitude α of said perturbing electromagnetic signal from $\phi_{\alpha=1}(t_\tau, t_{TR})$ comprises:
   determining $A(\Omega_\tau, \Omega_{TR})$ of said peak;
   calculating $A(\Omega_\tau, \Omega_{TR})^2$ of said peak; and,
   determining said amplitude α from $$\alpha = \sqrt{\frac{2 \times \sum_{\Omega_{TR},\Omega_\tau} A(\Omega_\tau, \Omega_{TR})^2 / N}{\sum_{t_{TR},t_\tau} \phi_{\alpha=1}(t_\tau, t_{TR})^2}} \ ;$$

removing, by the magnetic resonance device, said perturbing cyclic electromagnetic signal from the spin-echo measurement to obtain a spin-echo signal without the unwanted electromagnetic signal; and
producing, by the magnetic resonance device, at least one magnetic resonance image based on the obtained spin-echo signal.

5. The method according to either one of claim 1 or claim 4, wherein n=3.

6. The method according to either one of claim 1 or claim 4, wherein:
   said step of selecting a peak in each of said n NMR spectra comprises manually selecting a peak; and,
   said step of determining $A(\Omega_\tau, \Omega_{TR})$ of said peak comprises:
   manually selecting a region of said spectrum containing said peak, said region having an area A(R);
   calculating A(R); and,
   setting $A(\Omega_\tau, \Omega_{TR})$ of said peak to be equal to A(R).

7. The method according to either one of claim 1 or claim 4, wherein said NMR or MRI instrument comprises a permanent magnet and a plurality of pole pieces.

8. The method according to either one of claim 1 or claim 4, wherein:
   said step of selecting a peak in each of said n NMR spectra comprises manually selecting a peak; and,
   said step of determining A(Ωτ, ΩTR) of said peak comprises:
   manually selecting a region of said spectrum containing said peak, said region having an area A(R);
   calculating A(R); and,
   setting A(Ωτ, ΩTR) of said peak to be equal to A(R).

* * * * *